US011367759B2

(12) United States Patent
Huh

(10) Patent No.: US 11,367,759 B2
(45) Date of Patent: Jun. 21, 2022

(54) ELECTROLUMINESCENCE DISPLAY DEVICE HAVING A THROUGH-HOLE IN DISPLAY AREA

(71) Applicant: LG Display Co., Ltd., Seoul (KR)

(72) Inventor: HaeRi Huh, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 132 days.

(21) Appl. No.: 16/717,695

(22) Filed: Dec. 17, 2019

(65) Prior Publication Data

US 2020/0212140 A1 Jul. 2, 2020

(30) Foreign Application Priority Data

Dec. 31, 2018 (KR) .......................... 10-2018-0173299

(51) Int. Cl.
| | | |
|---|---|---|
| H01L 27/32 | (2006.01) | |
| H01L 33/24 | (2010.01) | |
| H01L 51/52 | (2006.01) | |
| H01L 25/075 | (2006.01) | |
| H01L 33/56 | (2010.01) | |

(52) U.S. Cl.
CPC ...... *H01L 27/3234* (2013.01); *H01L 25/0753* (2013.01); *H01L 27/326* (2013.01); *H01L 33/24* (2013.01); *H01L 33/56* (2013.01); *H01L 51/5253* (2013.01)

(58) Field of Classification Search
CPC ............ H01L 27/3234; H01L 25/0753; H01L 27/326; H01L 33/24; H01L 33/56; H01L 27/3246
See application file for complete search history.

(56) References Cited

U.S. PATENT DOCUMENTS

| | | | |
|---|---|---|---|
| 2017/0271421 A1 | 9/2017 | Jinbo et al. | |
| 2017/0288004 A1 | 10/2017 | Kim et al. | |
| 2020/0175918 A1* | 6/2020 | An | H01L 27/3276 |
| 2020/0328375 A1* | 10/2020 | Won | H01L 51/5253 |

FOREIGN PATENT DOCUMENTS

KR     10-2017-0128742 A     11/2017

* cited by examiner

*Primary Examiner* — Thanh Y. Tran
(74) *Attorney, Agent, or Firm* — Birch, Stewart, Kolasch & Birch, LLP

(57) ABSTRACT

An electroluminescence display device comprising a through-hole in a display area is discussed. The electroluminescence display device according to one embodiment of the present disclosure comprises a substrate having a display area and a non-display area arranged near the display area; a light emitting diode in the display area; an encapsulation layer on the light emitting diode; a through-hole arranged inside the display area to penetrate the substrate; an inner dam surrounding the through-hole; a trench arranged between the inner dam and the through-hole; and an etch-stopper arranged between the trench and the through-hole on the an insulating layer.

21 Claims, 7 Drawing Sheets

ELECTROLUMINESCENCE DISPLAY DEVICE HAVING A THROUGH-HOLE IN DISPLAY AREA

CROSS-REFERENCE TO RELATED APPLICATIONS

This application claims the priority benefit of the Korean Patent Application No. 10-2018-0173299 filed on Dec. 31, 2018, which is hereby incorporated by reference as if fully set forth herein.

BACKGROUND

Field of the Invention

The present disclosure relates to an electroluminescence display device having a through-hole in a display area, and more particularly, to an electroluminescence display device provided with a device, such as a camera hole, for receiving light by passing through a substrate or a through-hole, into which an additional device passing through a substrate can be inserted, arranged in a display area.

Discussion of the Related Art

Among display devices, an electroluminescence display device is a self-light emitting device, and has advantages in that a viewing angle and a contrast ratio are more excellent than those of other display devices. Further, since the electroluminescence display device does not require a separate backlight, it is advantageous that the electroluminescence display device is able to be thin and lightweight and has low power consumption. Furthermore, an organic light emitting display device of the electroluminescence display device has advantages in that it can be driven at a low direct current voltage, has a fast response speed, and has a low manufacturing cost.

The electroluminescence display device includes a plurality of electroluminescence diodes. The electroluminescence diode includes an anode electrode, a light emitting layer formed on the anode electrode, and a cathode electrode formed on the light emitting layer. If a high potential voltage is applied to the anode electrode and a low potential voltage is applied to the cathode electrode, holes in the anode electrode and electrons in the cathode electrode respectively move to the light emitting layer. When holes and electrons are combined with each other in the light emitting layer, exciton is formed during an excitation process, and light is generated due to energy from the exciton. The electroluminescence display device displays an image by electrically controlling the amount of light generated from the light emitting layers of the plurality of electroluminescence diodes partitioned by banks.

The electroluminescence display device is applied as various products in various fields due to its ultra-thin profile and excellent flexibility. However, the electroluminescence display device has a drawback in that it is vulnerable to water and oxygen. For this reason, in order that the electroluminescence display device is applied to various fields and developed as various types of display devices, a method for shielding water and oxygen from permeating into the electroluminescence display device is important. Particularly, if a through-hole is located inside a display area, development of a structure that can shield water and oxygen from permeating into the periphery of the through-hole is important.

SUMMARY

An object of the present disclosure is to provide an electroluminescence display device that maximizes an area of a display area, in which an additional device, such as a camera hole, for receiving light by passing through a substrate is arranged, or a through-hole for providing components by passing through a substrate is arranged in the display area for displaying an image. Another object of the present disclosure is to provide an electroluminescence display device having a structure that can shield water permeation from a light emitting diode of a display element arranged near a through-hole even though the through-hole is provided in a display area.

To achieve the above objects, an electroluminescence display device according to one embodiment of the present disclosure comprises a substrate having a display area and a non-display area arranged near the display area; a light emitting diode in the display area; an encapsulation layer on the light emitting diode; a through-hole arranged inside the display area to penetrate the substrate; an inner dam surrounding the through-hole; a trench arranged between the inner dam and the through-hole; and an etch-stopper arranged between the trench and the through-hole on an insulating layer.

For example, the electroluminescence display device further comprises the insulating layer disposed on the display area and passing below the inner dam and the trench except the through-hole.

For example, the electroluminescence display device further comprises an upper passivation film disposed on the display area and covering the inner dam, the trench and an upper surface of the etch-stopper.

For example, the display area includes pixels having the light emitting diode for expressing image information and a driving element for driving the light emitting diode, the pixels being arranged in a matrix arrangement. The through-hole is an area where the substrate, the light emitting diode and the driving element are not provided.

For example, the trench includes a recessed portion recessed to reach an upper surface of the substrate between the through-hole and the inner dam.

For example, the trench includes a bottom surface, an upper surface and a sidewall. The bottom surface is defined by the upper surface of the substrate exposed by the recessed portion of the trench. The upper surface of the trench is defined on the uppermost layer near the recessed portion of the trench. The sidewall of the trench connects the bottom surface of the trench with the upper surface of the trench. A dummy light emitting layer of the light emitting diode is disposed on the bottom surface of the trench.

For example, a light emitting layer is disposed on the upper surface of the trench.

For example, a dummy common electrode is disposed on the dummy light emitting layer and comes into contact with the sidewall of the trench.

For example, the sidewall of the trench has a saw-tooth shape due to a difference in an etching rate of thin film layers exposed to the sidewall of the trench.

For example, the insulating layer includes a first insulating film and a second insulating film, and an interval between the sidewall defined by the first insulating film is larger than an interval between the sidewall defined by the second insulating film.

For example, the electroluminescence display device further comprises a thin film layer covering the inner dam and the trench in the display area.

For example, the encapsulation layer comprises a first inorganic encapsulation layer, a second inorganic encapsulation layer and an organic encapsulation layer disposed between the first and second inorganic encapsulation layers.

For example, the thin film layer comprises the first inorganic encapsulation layer and the second inorganic encapsulation layer.

For example, the thin film layer further comprises a light emitting layer of the light emitting diode.

For example, an end of the insulating layer is arranged between an end of the thin film layer and an end of the through-hole.

For example, the end of the insulating layer is disposed closer to the through-hole than an end of the etch-stopper, and the end of the etch-stopper is disposed closer to the through-hole than an end of the first inorganic encapsulation layer.

For example, the upper passivation film covers a side surface of the etch-stopper adjacent to the through-hole and a part of the upper surface of the etch-stopper.

For example, the upper passivation film covers stepped portions formed by the thin film layer, the etch stopper and the insulating layer.

For example, the upper passivation film reaches to an end of the through-hole.

For example, the light emitting layer covers a part of the etch-stopper in the display area, and is disconnected at the trench. The first inorganic encapsulation layer and the second inorganic encapsulation layer cover one portion of the etch-stopper in the display area. The upper passivation film covers the second inorganic encapsulation layer, the first inorganic encapsulation layer, a common electrode, the light emitting layer and the etch stopper.

For example, the thin film layer covers a part of the upper surface of the etch-stopper.

For example, a touch electrode is disposed on the upper passivation film. The touch electrode and the touch buffer film included in a touch sensor can be disposed on the encapsulation layer. The touch electrode can be disposed on the touch buffer film in contact with the encapsulation layer. Alternatively, the touch electrode can be disposed on the encapsulation layer without the touch buffer film. The touch electrode can be disposed on the encapsulation layer without the touch buffer film. In this case, the touch buffer film and the touch electrode are sequentially formed on the encapsulation layer. And then an organic cover layer can be disposed on the touch electrode.

For example, the etch-stopper is composed of organic materials. In addition, at least one of a touch dielectric film and the touch buffer film included in the mutual capacitance touch sensor having the first and second touch electrodes can be formed to extend to at least one of the inner dam.

In the electroluminescence display device according to the present disclosure, since the through-hole is provided in the display area, an area ratio occupied by the non-display area is minimized, and an area ratio of the display area is maximized. In the electroluminescence display device according to the present disclosure, since the trench is provide near the through-hole, continuity of the light emitting layer is partially disconnected, whereby water is prevented from permeating into the light emitting diode. Also, an upper passivation film covering a section of thin films etched in a portion of the through-hole is further provided, whereby water or oxygen is prevented from permeating into a pixel area. Moreover, exposed sections of the thin films deposited in the portion of the through-hole are not arranged on the same vertical surface but arranged on a plurality of vertical surfaces spaced apart from one another at a certain distance, whereby a structure for enhancing an encapsulation power and an adhesive power of the upper passivation film is provided. In the electroluminescence display device according to the present disclosure, since a hole passing through the display panel is provided in the display area, applicability of the display device is high, and the display device can be applied to various products. In the electroluminescence display device according to the present disclosure, even though the hole passing through the display panel is formed in the display area, external water and particles are shielded from permeating and being diffused into the display element, whereby it is possible to make sure of stability and lifetime of the product.

In addition to the effects of the present disclosure as mentioned above, additional objects and features of the present disclosure will be clearly understood by those skilled in the art from the following description of the present disclosure.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain the principle of the disclosure. In the drawings.

DETAILED DESCRIPTION OF THE DISCLOSURE

Figure 1:
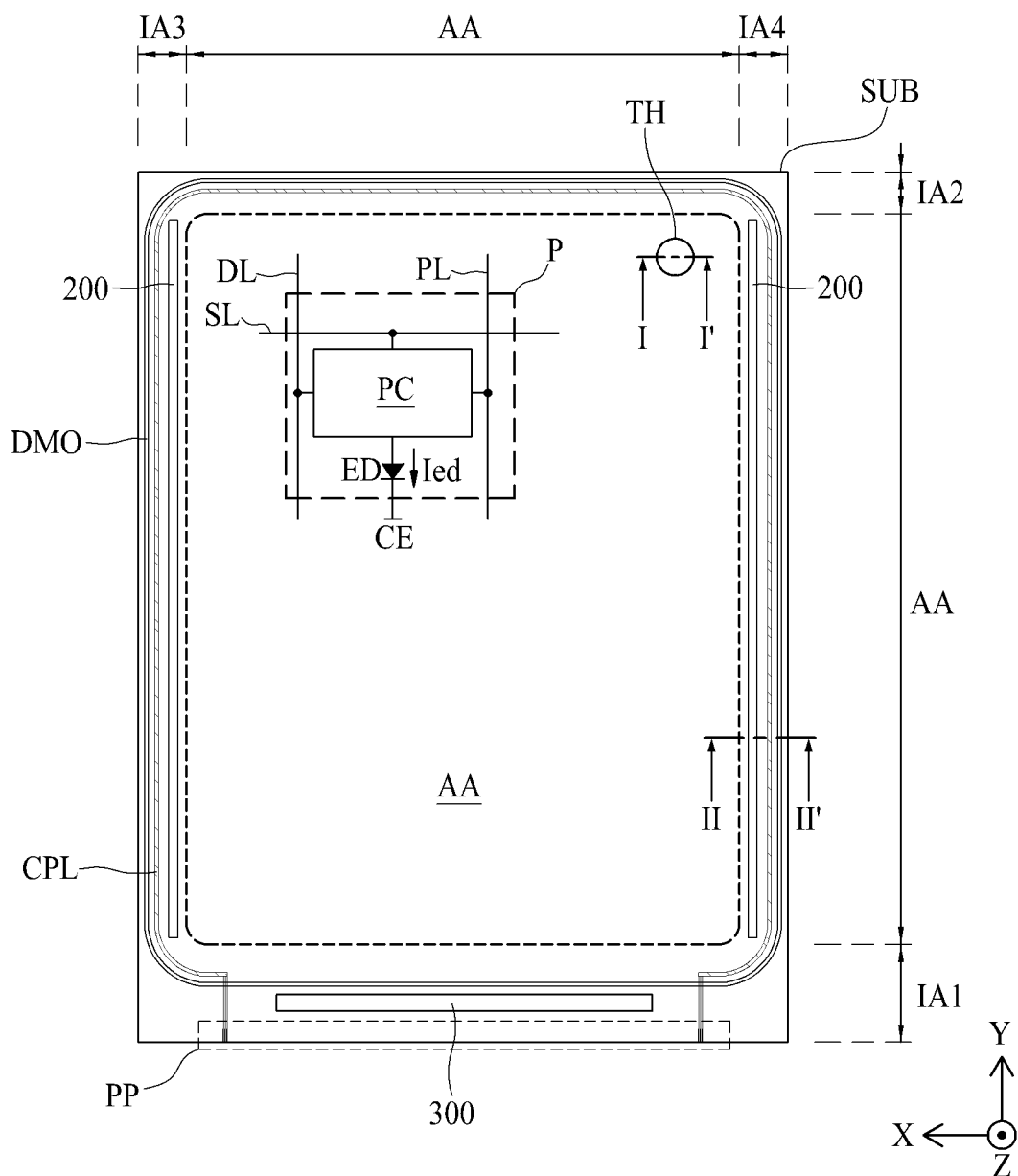
FIG. 1 is a plane view illustrating an electroluminescence display device having a through-hole in a display area according to the present disclosure.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Further, the present disclosure is only defined by scopes of claims.

A shape, a size, a ratio, an angle, and a number disclosed in the drawings for describing embodiments of the present disclosure are merely an example, and thus, the present disclosure is not limited to the illustrated details. Like reference numerals refer to like elements throughout the specification. In the following description, when the detailed description of the relevant known function or configuration is determined to unnecessarily obscure the important point of the present disclosure, the detailed description will be omitted.

In a case where 'comprise', 'have', and 'include' described in the present disclosure are used, another part can be added unless 'only-' is used. The terms of a singular form can include plural forms unless referred to the contrary.

In construing an element, the element is construed as including an error range although there is no explicit description.

In describing a position relationship, for example, when the position relationship is described as 'upon-%', 'above-%', 'below-%', and 'next to-', one or more portions can be arranged between two other portions unless 'just' or 'direct' is used.

In describing a time relationship, for example, when the temporal order is described as 'after-', 'subsequent-', 'next-', and 'before-', a case which is not continuous can be included unless 'just' or 'direct' is used.

It will be understood that, although the terms "first", "second", etc. can be used herein to describe various elements, these elements should not be limited by these terms. These terms are only used to distinguish one element from another. For example, a first element could be termed a second element, and, similarly, a second element could be termed a first element, without departing from the scope of the present disclosure.

The term "at least one" should be understood as including any and all combinations of one or more of the associated listed items. For example, the meaning of "at least one of a first item, a second item, and a third item" denotes the combinations of all items proposed from two or more of the first item, the second item, and the third item as well as the first item, the second item, or the third item.

Features of various embodiments of the present disclosure can be partially or overall coupled to or combined with each other, and can be variously inter-operated with each other and driven technically as those skilled in the art can sufficiently understand. The embodiments of the present disclosure can be carried out independently from each other, or can be carried out together in co-dependent relationship.

Hereinafter, an example of an electroluminescence display device according to the present disclosure will be described in detail with reference to the accompanying drawings. Wherever possible, the same reference numbers will be used throughout the drawings to refer to the same or like parts.

Hereinafter, an electroluminescence display device according to the present disclosure will be described in detail with reference to the accompanying drawings. FIG. 1 is a plane view illustrating an electroluminescence display device having a through-hole in a display area according to the present disclosure. All the components of the electroluminescence display device according to all embodiments of the present disclosure are operatively coupled and configured.

Referring to FIG. 1, the electroluminescence display device according to the present disclosure includes a substrate SUB, a pixel P, a common power line CPL, an outer dam DMO, driving portions PP 200 and 300, and a through-hole TH.

The substrate SUB is a base substrate (or base layer), and includes a plastic material or a glass material. In view of characteristics of a display device, it is preferable that the substrate SUB is transparent. However, as the case can be, for example, in case of a top emission type display device, an opaque material can be used as the substrate SUB.

The substrate SUB according to one example can have a rectangular shape on a plane, a rounded rectangular shape, each of which corner portions is rounded with a certain curvature radius, or a non-rectangular shape having at least six sides. In this case, the substrate SUB having a non-rectangular shape can include at least one protrusion or at least one notch portion.

The substrate SUB according to one example can be categorized into a display area AA and a non-display area. The display area AA is provided at most of center portions of the substrate SUB, and can be defined as an area for displaying an image. The display area AA according to one example can have a rectangular shape on a plane, a rounded rectangular shape, each of which corner portions is rounded with a certain curvature radius, or a non-rectangular shape having at least six sides. In this case, the display area AA having a non-rectangular shape can include at least one protrusion or at least one notch portion.

The non-display area is provided on an edge area of the substrate SUB to surround the display area AA, and can be defined as an area where an image is not displayed or a peripheral area. The non-display area IA according to one example can include a first non-display area IA1 provided on a first edge of the substrate SUB, a second non-display area IA2 provided on a second edge of the substrate SUB in parallel with the first non-display area IA1, a third non-display area IA3 provided on a third edge of the substrate SUB, and a fourth non-display area IA4 provided on a fourth edge of the substrate SUB in parallel with the third non-display area IA3. For example, the first non-display area IA1 can be, but not limited to, an lower (or upper) edge area of the substrate SUB, the second non-display area IA2 can be, but not limited to, a upper (or lower) edge area of the substrate SUB, the third non-display area IA3 can be, but not limited to, a left (or right) edge area of the substrate SUB, and the fourth non-display area IA4 can be, but not limited to, a right (or left) edge area of the substrate SUB. For convenience of description, the first to fourth non-display areas can be referred to as "non-display area" without being referred to as a non-display area of a specific area. In this case, the non-display areas can be marked with a reference numeral "IA".

The pixel P is arranged on the display area AA of the substrate SUB. The pixel P according to one example can be comprised of a plurality of pixels arranged in a matrix arrangement, and can be arranged in the display area AA of the substrate SUB. The pixel P can be arranged in each of areas defined by scan lines SL, data lines DL, and pixel driving power lines PL.

The scan line SL is longitudinally extended along a first direction X and arranged along a second direction Y crossing the first direction X at a certain interval. The display area AA of the substrate SUB includes a plurality of scan lines SL spaced apart from one another along the second direction Y in parallel with the first direction X. In this case, the first direction X can be defined as a horizontal direction of the substrate SUB and the second direction Y can be defined as a vertical direction of the substrate SUB, or vice versa without limitation to this case.

The data line DL is longitudinally extended along the second direction Y and arranged along the first direction X at a certain interval. The display area AA of the substrate SUB includes a plurality of data lines DL spaced apart from one another along the first direction X in parallel with the second direction Y.

The pixel driving power line PL can be arranged on the substrate SUB to be parallel with the data line DL. The display area AA of the substrate SUB includes a plurality of pixel driving power lines PL parallel with the data lines DL. Optionally, the pixel driving power lines PL can be arranged to be parallel with the scan lines SL.

One unit pixel can include a red subpixel, a green subpixel, and a blue subpixel. Moreover, one unit pixel can further include a white subpixel. The pixels P according to one example can be arranged on the display area AA to have a stripe structure. The stripe structure means that subpixels of the same color are continuously arranged on one row or column and subpixels of different colors are arranged alternately. For example, the red subpixels can be arranged to constitute a first column, the green subpixels can be arranged to constitute a second column, the blue subpixels can be arranged to constitute a third column, and a red column, a green column and a blue column can be arranged repeatedly.

The pixels P according to another example can be arranged on the display area AA to have a pentile structure. In this case, one unit pixel can include at least one red subpixel, at least two green subpixels, and at least one blue subpixel, which are arranged in a polygonal shape two-dimensionally. For example, one unit pixel having a pentile structure can be arranged such that one red subpixel, two green subpixels and one blue subpixel have an octagonal shape two-dimensionally. In this case, the blue subpixel can have an opening area (or light emitting area) which is relatively the greatest, and the green subpixel can have an opening area which is relatively the smallest. In the following description, "pixel" may not be identified as a unit pixel or a subpixel. For convenience, one subpixel can be described as "pixel".

The pixel P can include a pixel circuit PC electrically connected with its adjacent scan line SL, data line DL and pixel driving power line PL, and a light emitting diode ED electrically connected with the pixel circuit PC.

The pixel circuit PC controls a data current Ted flowing from the pixel driving power line PL to the light emitting diode ED based on a data voltage supplied from its adjacent data line DL in response to a scan signal supplied from at least one scan line SL adjacent thereto.

The pixel circuit PC according to one example can include at least two thin film transistors and one capacitor. For example, the pixel circuit PC according to one example can include a driving thin film transistor supplying the data current Ted based on the data voltage to the light emitting diode ED, a switching thin film transistor supplying the data voltage supplied from the data line DL to the driving thin film transistor, and a capacitor storing a gate-source voltage of the driving thin film transistor.

The pixel circuit PC according to another example can include at least three thin film transistors and at least one capacitor. For example, the pixel circuit PC according to another example can include a current supply circuit, a data supply circuit and a compensation circuit in accordance with an operation (or function) of each of at least three thin film transistors. In this case, the current supply circuit can include a driving thin film transistor supplying the data current Ted based on the data voltage to the light emitting diode ED. The data supply circuit can include at least one switching thin film transistor supplying the data voltage supplied from the data line DL to the current supply circuit in response to at least one scan signal. The compensation circuit can include at least one compensation thin film transistor compensating for a change of a characteristic value (threshold voltage and/or mobility) of the driving thin film transistor in response to at least one scan signal.

The light emitting diode ED emits light by means of the data current Ted supplied from the pixel circuit PC to emit light of luminance corresponding to the data current Ted. In this case, the data current Ted can flow from the pixel driving power line PL to the common power line CPL through the driving thin film transistor and the light emitting diode ED.

The light emitting diode ED according to one example can include an inorganic light emitting diode or an organic light emitting diode. For example, the light emitting diode ED can include a pixel driving electrode AE (or first electrode or anode) electrically connected with the pixel circuit PC, a light emitting layer EL formed on the pixel driving electrode, and a common electrode CE (or second electrode or cathode) electrically connected with the light emitting layer.

The common power line CPL is arranged on the non-display area IA of the substrate SUB and electrically connected with the common electrode CE arranged on the display area AA. The common power line CPL according to one example is arranged along the second to fourth non-display areas IA2, IA3 and IA4 adjacent to the display area AA of the substrate SUB while having a certain line width, and surrounds the other portion except a portion of the display area AA adjacent to the first non-display area IA1 of the substrate SUB. One end of the common power line CPL can be arranged on one side of the first non-display area IA1, and the other end of the common power line CPL can be arranged on the other side of the first non-display area IA1. One end and the other end of the common power line CPL can be arranged to surround the second to fourth non-display areas IA2, IA3 and IA4. Therefore, the common power line CPL according to one example can two-dimensionally have a '∩' shape of which one side corresponding to the first non-display area IA1 of the substrate SUB is opened.

The electroluminescence display device according to the present disclosure can further include an encapsulation layer for protecting the light emitting diode ED. The encapsulation layer can be formed on the substrate SUB to surround an upper surface and a side of the display area AA and the common power line CPL. Meanwhile, the encapsulation layer can expose one end and the other end of the common power line CPL in the first non-display area IA1. The encapsulation layer can prevent oxygen or water from being permeated into the light emitting diode ED provided in the display area AA. The encapsulation layer according to one example can include at least one inorganic film. The encapsulation layer according to another example can include a plurality of inorganic films and an organic film interposed among the plurality of inorganic films.

The driving portion according to one embodiment of the present disclosure can include a pad portion PP, a gate driving circuit 200, and a driving integrated circuit 300.

The pad portion PP can include a plurality of pads provided in the non-display area IA of the substrate SUB. The pad portion according to one example can include a plurality of common power supply pads, a plurality of data input pads, a plurality of power supply pads and a plurality of control signal input pads, which are provided in the first non-display area IA1 of the substrate SUB.

The gate driving circuit 200 is provided in the third non-display area IA3 and/or the fourth non-display area IA4 of the substrate SUB and connected with the scan lines SL provided in the display area AA in a one-to-one relationship. The gate driving circuit 200 can be formed as an integrated circuit in the third non-display area IA3 and/or the fourth non-display area IA4 of the substrate SUB together with a manufacturing process of the pixel P, that is, a manufacturing process of the thin film transistor. The gate driving circuit 200 generates a scan signal based on a gate control signal supplied from the driving integrated circuit 300 and output the scan signal in accordance with a given order, thereby driving each of the plurality of scan lines SL in accordance with a given order. The gate driving circuit 200 according to one example can include a shift register.

The outer dam DMO can have a closed curve structure in which it is provided in the first non-display area IA1, the second non-display area IA2, the third non-display area IA3 and the fourth non-display area IA4 of the substrate SUB to surround the periphery of the display area AA. For example, the outer dam DMO can be arranged outside the common power line CPL and therefore located at the outermost above the substrate SUB. Preferably, the pad portion PP and the driving integrated circuit 300 are arranged in an outer area of the outer dam DMO.

Although FIG. 1 shows that the outer dam DMO is arranged at the outermost, the outer dam DMO is not limited to the example of FIG. 1. As another example, the outer dam DMO can be arranged between the common power line CPL and the gate driving circuit 200. As other example, the outer dam DMO can be arranged between the display area AA and the gate driving circuit 200.

The driving integrated circuit 300 is packaged in a chip packaging area defined in the first non-display area IA1 of the substrate SUB through a chip packaging (bonding) process. Input terminals of the driving integrated circuit 300 are directly connected with the pad portion PP and therefore electrically connected with the plurality of data lines DL and the plurality of pixel driving power lines PL, which are provided in the display area AA. The driving integrated circuit 300 receives various power sources, timing synchronizing signals and digital image data, which are input from a display driving circuit portion (or host circuit) through the pad portion PP, controls driving of the gate driving circuit 200 by generating a gate control signal in accordance with the timing synchronizing signals and at the same time converts the digital image data to an analog type pixel data voltage to supply the converted data voltage to the corresponding data line DL.

The through-hole TH physically passes through the display device. For example, the through-hole TH can be formed to pass through only a display panel constituting the display device. In this case, a polarizer or cover glass bonded to an upper surface of the display panel can have a structure for covering the through-hole TH without being passed through by the through-hole TH. If a through-hole TH is a hole for transmitting light, such as a camera hole or a light sensor hole, the through-hole TH can pass through only the display panel without passing through the polarizer or the cover glass. For another example, if an additional device for fully passing through the display device is to be provided, the through-hole TH for opening all of the display panel, an optical film bonded to an upper portion of the display panel, and the cover glass can be provided.

Since the through-hole TH has a structure for opening a partial area of the display panel without arranging a display element therein, it is likely that the through-hole TH is not arranged in the display area AA but arranged in the non-display area IA. In this case, a width or a width area of the display area AA, which corresponds to a width or width area of the through-hole TH, as well as an area of the through-hole TH is reduced, whereby an area ratio of the display area AA occupied in the display panel is reduced. The present disclosure is characterized in that the through-hole TH is arranged in the display area AA. Therefore, the display element is not arranged in the area related to the through-hole TH inside the display area AA but arranged near the through-hole TH, whereby the area ratio of the display area AA occupied in the display panel can be maximized.

Figure 2:
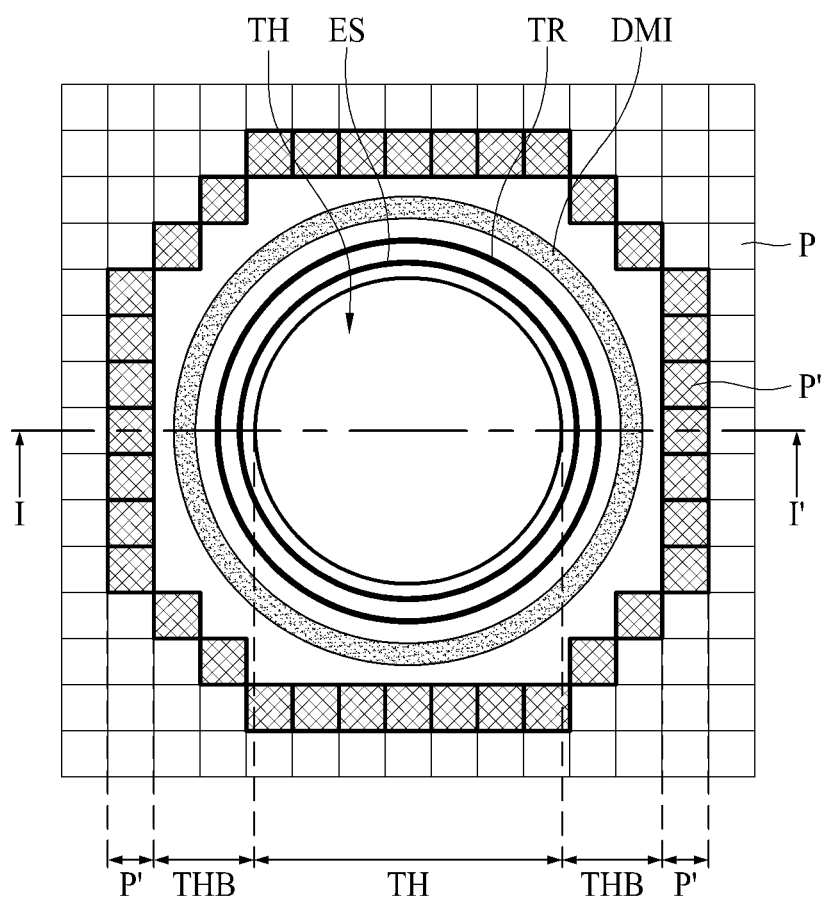
FIG. 2 is a plane enlarged view illustrating a structure of a through-hole arranged in a display area in an electroluminescence display device according to the present disclosure.

Hereinafter, a structural characteristic of the through-hole, which is a main characteristic of the present disclosure, will be described in more detail with reference to FIG. 2. FIG. 2 is a plane enlarged view illustrating a structure of a through-hole arranged in a display area in an electroluminescence display device according to the present disclosure.

Referring to FIG. 2, the through-hole TH is arranged inside the display area AA. The pixels P are arranged near the through-hole TH. Among the pixels P, the pixels P arranged to be close to the through-hole TH can be defined as adjacent pixels P'. A hole boundary portion THB can be defined between the adjacent pixels P' and the through-hole TH. The adjacent pixels P' are pixels for normally displaying image information in the same manner as the other pixels P. However, since the adjacent pixels P' are arranged to be close to the through-hole TH, they are referred to as the adjacent pixels P'.

An inner dam DMI, a trench TR, and an etch-stopper ES are arranged in the hole boundary portion THB. Particularly, the inner dam DMI is arranged between the through-hole TH and the adjacent pixels P'. The inner dam DMI has a closed curve shape surrounding the through-hole TH while corresponding to the shape of the through-hole TH. Although the inner dam DMI can have a closed curve shape different from that of the through-hole TH, the inner dam DMI can have the same shape as that of the through-hole TH and can have a closed curve shape different from that of the through-hole in size. For example, the inner dam DMI and the through-hole TH can have a concentric circle shape and can be arranged to be spaced apart from each other at a certain interval.

The trench TR can be arranged between the through-hole TH and the inner dam DMI. The trench TR also has a closed curve shape surrounding the through-hole TH while corresponding to the shape of the through-hole TH. Although the trench TR can have a closed curve shape different from that of the through-hole TH, the trench TR can have the same shape as that of the through-hole TH and can have a closed curve shape different from that of the through-hole in size. For example, as shown in FIG. 2, the trench TR and the through-hole TH can have a concentric circle shape and can be arranged to be spaced apart from each other at a certain interval.

The etch-stopper ES is arranged between the through-hole TH and the trench TR. The etch-stopper ES is intended to allow an upper passivation film for preventing water permeation from occurring to have a certain thickness, and its structure and function will be described in detail with reference to various embodiments together with the following cross-sectional views.

First Embodiment

Figure 3:
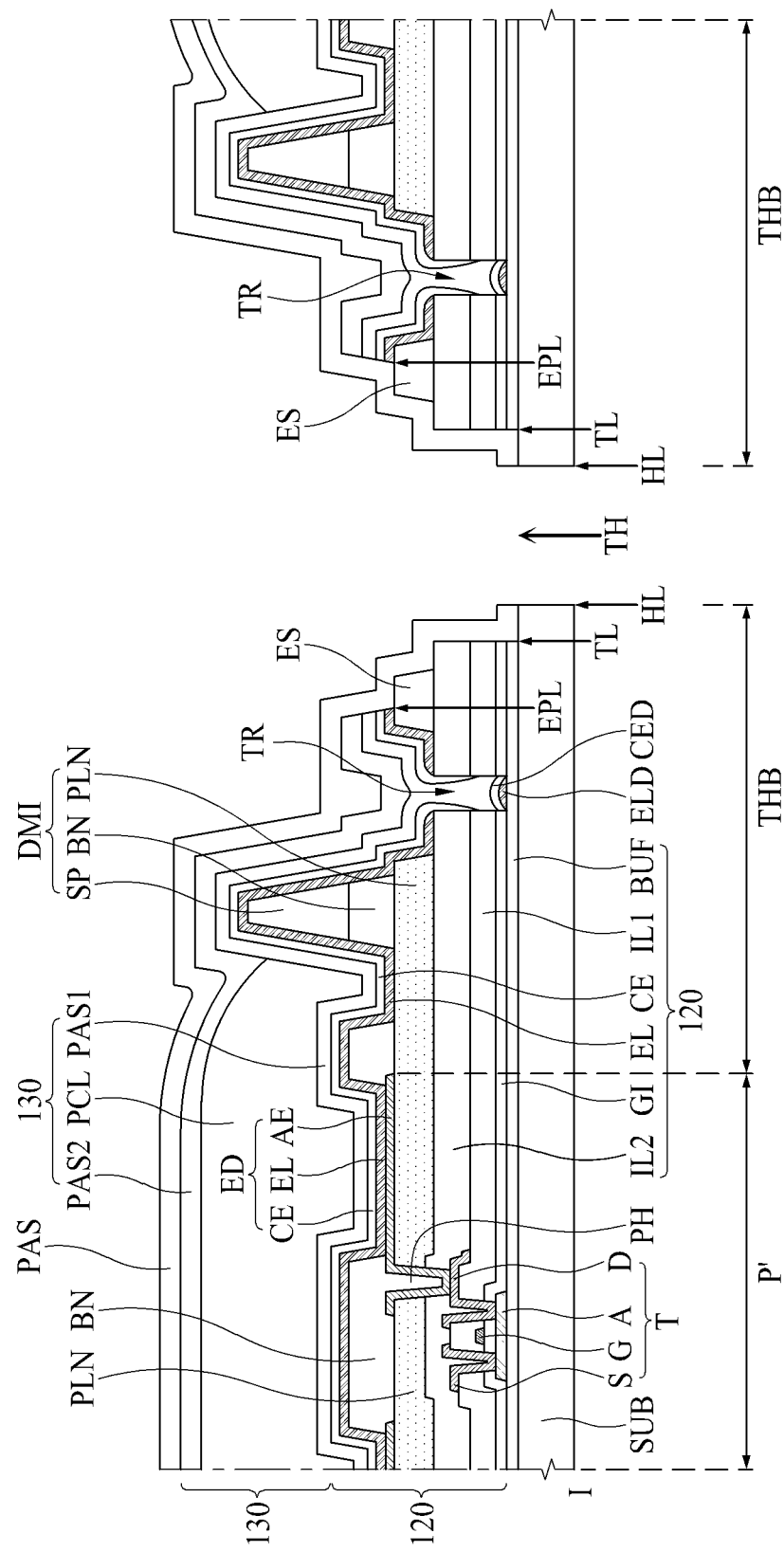
FIG. 3 is a cross-sectional view taken along line I-I' of FIG. 1, illustrating a structure of a portion where a through-hole is arranged in an electroluminescence display device according to a first embodiment of the present disclosure.
Figure 4:
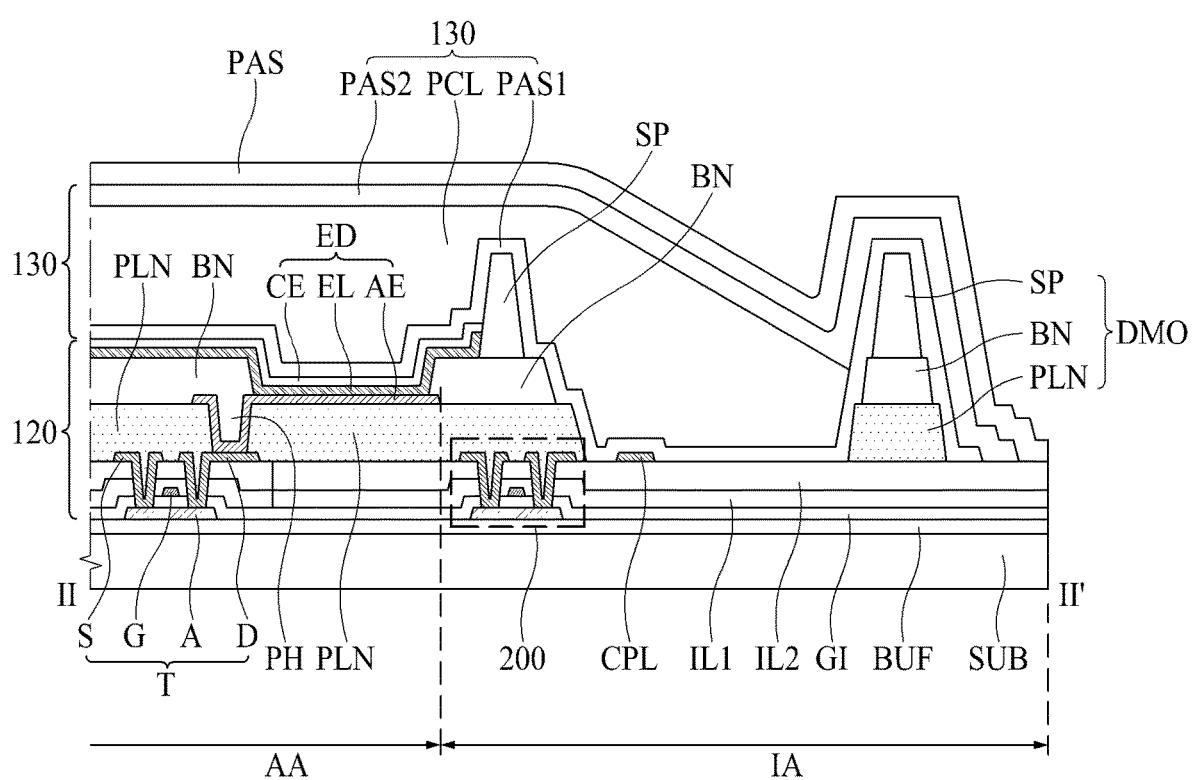
FIG. 4 is a cross-sectional view taken along line II-II' of FIG. 1, illustrating a structure of a boundary portion of a display area and a non-display area in the electroluminescence display device according to the first embodiment of the present disclosure.

Hereinafter, a sectional structure of the electroluminescence display device comprising a through-hole in a display area according to the first embodiment of the present disclosure will be described with reference to FIGS. 3 to 5. FIG. 3 is a cross-sectional view taken along line I-I' of FIG. 1, illustrating a structure of a portion where a through-hole is arranged in the electroluminescence display device according to the first embodiment of the present disclosure. FIG. 4 is a cross-sectional view taken along line II-II' of FIG. 1, illustrating a structure of a boundary portion of a display area and a non-display area in the electroluminescence display device according to the first embodiment of the present disclosure.

Referring to FIGS. 3 and 4, the electroluminescence display device according to the first embodiment of the present disclosure can include a substrate SUB, a buffer film BUF, a pixel array layer 120, a spacer SP, an inner dam DMI, an outer dam DMO, an encapsulation layer 130, an upper passivation film PAS, an etch-stopper ES, and a through-hole TH.

The substrate SUB can include a display area AA and a non-display area IA surrounding the display area AA. The substrate SUB is a base layer, and includes a plastic material or a glass material. The substrate SUB according to one example can have an opaque or colored polyimide material. The substrate SUB can be a flexible substrate or a rigid substrate. For example, the flexible substrate SUB of a glass material can be a thin type glass substrate having a thickness of 100 micrometers or less or a glass substrate etched by a substrate etching process to have a thickness of 100 micrometers or less.

The buffer film BUF is deposited on an upper surface of the substrate SUB to cover an entire surface of the substrate SUB. The buffer film BUF is formed on the upper surface of the substrate SUB to shield water from permeating into the pixel array layer through the substrate SUB vulnerable to water permeation. The buffer film BUF according to one example can be made of a plurality of inorganic films deposited alternately. For example, the buffer film BUF can be formed of a multi-layered film of one or more inorganic films of a silicon oxide ($SiO_x$) film, a silicon nitride ($SiN_x$) film and a silicon oxynitride (SiON) film, which are deposited alternately. The buffer film BUF can have a deposited structure of at least two or more organic buffer films and inorganic buffer films. Also, if necessary, the buffer film BUF can be omitted.

The pixel array layer 120, the inner dam DMI, the outer dam DMO, the encapsulation layer 130, the etch-stopper ES, and the upper passivation film PAS are sequentially formed on an upper surface of the buffer film BUF. The through-hole TH is arranged inside the display area AA of the substrate SUB. The through-hole TH is surrounded by the inner dam DMI, and is an open area where the substrate SUB, the pixel array layer 120, the spacer SP, the encapsulation layer 130, the etch-stopper ES and the upper passivation film PAS are all removed or are not formed. A polarizer and/or a cover glass can further be disposed or bonded onto the upper passivation film PAS. In this case, in one example, the through-hole TH can be formed as penetrating the polarizer and the cover glass. Alternatively, the through-hole TH can have a structure of which upper portion is blocked as the polarizer and the cover glass cover the through-hole TH.

The pixel array layer 120 is deposited on the buffer film BUF or the substrate SUB. The pixel array layer 120 can include a thin film transistor layer, a planarization layer PLN, a bank BN, a spacer SP, and a light emitting diode ED.

The thin film transistor layer is respectively provided in a plurality of pixels P defined in the display area AA of the substrate SUB and a gate driving circuit 200 defined in a fourth non-display area IA4 of the substrate SUB.

The thin film transistor layer according to one example includes a thin film transistor T, a gate insulating film GI, a first insulating film IL1 and a second insulating film IL2. In this case, the thin film transistor T shown in FIG. 3 can be a driving thin film transistor electrically connected with the light emitting diode ED.

The thin film transistor T includes a semiconductor layer A, a gate electrode G, a source electrode S and a drain electrode D, which are formed on the substrate SUB or the buffer film BUF. FIGS. 3 and 4 show, but is not limited to, a top gate structure of the thin film transistor T, in which the gate electrode G is arranged above the semiconductor layer A. For another example, the thin film transistor T can have a bottom gate structure in which the gate electrode G is arranged below the semiconductor layer A, or a double gate structure in which the gate electrode G is arranged above and below the semiconductor layer A.

The semiconductor layer A can be formed on the substrate SUB or the buffer film BUF. The semiconductor layer A can include a silicon based semiconductor material, an oxide based semiconductor material, or an organic based semiconductor material, and can have a single layered structure or a multi-layered structure.

The gate insulating film GI can be formed on the entire substrate SUB to cover the semiconductor layer A. The gate insulating film GI can be formed of an inorganic film, for example, a silicon oxide ($SiO_x$) film, a silicon nitride ($SiN_x$) film, or a multi-layered film of $SiO_x$ and $SiN_x$.

The gate electrode G can be formed on the gate insulating film GI to overlap the semiconductor layer A. The gate electrode G can be formed together with the scan line SL. The gate electrode G according to one example can be formed of a single layer or multi-layer of any one of Mo, Al, Cr, Au, Ti, Ni, Nd, Cu, and their alloy.

The first insulating film IL1 and the second insulating film IL2 can sequentially be deposited on the entire substrate SUB to cover the gate electrode G and the gate insulating film GI. In the same manner as the gate insulating film GI, the first insulating film IL1 and the second insulating film IL2 can be formed of an inorganic film, for example, a silicon oxide ($SiO_x$) film, a silicon nitride ($SiN_x$) film, or a multi-layered film of $SiO_x$ and $SiN_x$. The first insulating film IL1 and the second insulating film IL2 can be formed of a single insulating film.

The source electrode S and the drain electrode D can be formed on the second insulating film IL2 to overlap the semiconductor layer A by interposing the gate electrode G therebetween. The source electrode S and the drain electrode D can be formed together with the data line DL, the pixel driving power line PL and the common power line CPL. That is, the source electrode S, the drain electrode D, the data line DL, the pixel driving power line PL and the common power line CPL are respectively formed by a patterning process for a source-drain electrode material at the same time.

Each of the source electrode S and the drain electrode D can be connected to the semiconductor layer A through an electrode contact hole that passes through the first insulating film IL1, the second insulating film IL2 and the gate insulating film GI. The source electrode S and the drain electrode D can be formed of a single layer or multi-layer of any one of Mo, Al, Cr, Au, Ti, Ni, Nd, Cu, and their alloy. In this case, the source electrode S of the thin film transistor T shown in FIG. 3 can electrically be connected with the pixel driving power line PL.

As described above, the thin film transistor T provided in the pixel P of the substrate SUB constitutes a pixel circuit PC. Also, the gate driving circuit 200 arranged in the fourth non-display area IA4 of the substrate SUB can include a thin film transistor the same as or similar to the thin film transistor T provided in the pixel P.

The planarization layer PLN is formed on the entire substrate SUB to cover the thin film transistor layer. The planarization layer PLN provides a planarization surface on the thin film transistor layer. The planarization layer PLN according to one example can be formed of an organic film such as acrylic resin, epoxy resin, phenolic resin, polyamide resin, or polyimide resin.

The planarization layer PLN according to another example can include a pixel contact hole PH for exposing the drain electrode D of the driving thin film transistor provided in the pixel P.

The bank BN (or bank pattern) is arranged on the planarization layer PLN and defines an opening area (or light emitting area) inside the pixel P of the display area AA. The bank BN can be expressed as a pixel defining film.

The light emitting diode ED includes a pixel driving electrode AE, a light emitting layer EL, and a common electrode CE. The pixel driving electrode AE is formed on the planarization layer PLN and electrically connected to the drain electrode D of the driving thin film transistor through the pixel contact hole PH provided in the planarization layer PLN. In this case, the other edge portion except a center portion of the pixel driving electrode AE overlapped with the opening area of the pixel P can be covered by the bank BN. The bank BN can define an opening area of the pixel P by covering the edge portion of the pixel driving electrode AE.

The pixel driving electrode AE according to one example can include a metal material of high reflectivity. For example, the pixel driving electrode AE can be formed of a multi-layered structure such as a deposited structure (Ti/Al/Ti) of aluminum (Al) and titanium (Ti), a deposited structure (ITO/Al/ITO) of Al and ITO, an APC (Ag/Pd/Cu) alloy, and a deposited structure (ITO/APC/ITO) of APC alloy and ITO, or can include a single layered structure made of a material of any one or an alloy material of two or more selected from Ag, Al, Mo, Au, Mg, Ca and Ba.

The light emitting layer EL is entirely formed on the display area AA of the substrate SUB to cover the pixel driving electrode AE and the bank BN. The light emitting layer EL according to one example can include two or more light emitting portions vertically stacked or deposited to emit a white light. The light emitting layer EL according to one example can include a first light emitting portion and a second light emitting portion for emitting a first light and a second light, so that the light emitting layer EL can emits the white light by combination of the first light and the second light. In this case, the first light emitting portion emits the first light, and can include any one of a blue light emitting portion, a green light emitting portion, a red light emitting portion, a yellow light emitting portion, and a yellow-green light emitting portion. The second light emitting portion can include any one of the blue light emitting portion, the green light emitting portion, the red light emitting portion, the yellow light emitting portion, and the yellow-green light emitting portion, in which the second light emitting portion emits the second light for optically compensating the first light.

The light emitting layer EL according to another example can include any one of a blue light emitting portion, a green light emitting portion and a red light emitting portion to emit a color light corresponding to a color set in the pixel P. For example, the light emitting layer EL can include any one of an organic light emitting layer, an inorganic light emitting layer and a quantum-dot light emitting layer, or can include a deposited or combination structure of the organic light emitting layer (or the inorganic light emitting layer) and the quantum-dot light emitting layer.

Additionally, the light emitting diode ED according to one example can further include a functional layer for improving light emission efficiency and/or lifetime of the light emitting layer EL.

The common electrode CE is formed to be electrically connected with the light emitting layer EL. The common electrode CE is formed on the entire display area AA of the substrate SUB and therefore commonly connected with the light emitting layers EL provided in the respective pixels P.

The common electrode CE according to one example can include a transparent conductive material or a semi-transmissive conductive material, which can transmit light. If the common electrode CE is formed of a semi-transmissive conductive material, light emission efficiency of light emitted from the light emitting diode ED can be enhanced through a micro cavity structure. The semi-transmissive conductive material according to one example can include Mg, Ag, or an alloy of Mg and Ag. Additionally, a capping layer for improving emission efficiency of light by controlling a refractive index of light emitted from the light emitting diode ED can further be formed on the common electrode CE.

The spacer SP can be arranged to be distributed in a non-opening area inside the display area AA, that is, an area where the light emitting diode ED is not arranged. The spacer SP is intended to allow a screen mask and a substrate not to be in contact with each other during a process of depositing the light emitting layer EL. The spacer SP is arranged on the bank BN, and can be deposited to allow the light emitting layer EL and the common electrode CE to overstride (or cover as following the profile) the spacer SP arranged inside the display area AA.

As the case can be, the light emitting layer EL and/or the common electrode CE may not overstride the spacer SP. Since the spacer SP is arranged in only a portion of the bank BN inside the display area AA, the common electrode CE has a structure connected with the display area AA while covering the display area AA even though the common electrode CE does not overstride the spacer SP.

The encapsulation layer 130 is formed to surround an upper surface and a side of the pixel array layer 120. The encapsulation layer 130 serves to prevent oxygen or water from being permeated into the light emitting diode ED.

The encapsulation layer 130 according to one example can include a first inorganic encapsulation layer PAS1, an organic encapsulation layer PCL on the first inorganic encapsulation layer PAS1, and a second inorganic encapsulation layer PAS2 on the organic encapsulation layer PCL. The first inorganic encapsulation layer PAS1 and the second inorganic encapsulation layer PAS2 serve to shield water or oxygen from permeating into the light emitting diode ED. Each of the first inorganic encapsulation layer PAS1 and the second inorganic encapsulation layer PAS2 can be formed of an inorganic material such as a silicon nitride, an aluminum nitride, a zirconium nitride, a titanium nitride, a hafnium nitride, a tantalum nitride, a silicon oxide, an aluminum oxide, or a titanium oxide. The first inorganic encapsulation layer PAS1 and the second inorganic encapsulation layer PAS2 can be formed by a Chemical Vapor Deposition (CVD) process or an Atomic Layer Deposition (ALD) process.

The organic encapsulation layer PCL has a sealed structure by the first inorganic encapsulation layer PAS1 and the second inorganic encapsulation layer PAS2. The organic encapsulation layer PCL can be formed to be relatively thicker than the first inorganic encapsulation layer PAS1 and/or the second inorganic encapsulation layer PAS2 to adsorb and/or shield particles that can occur during a manufacturing process. The organic encapsulation layer PCL has a sealed structure by the first inorganic encapsulation layer PAS1 and the second inorganic encapsulation layer PAS2. The organic encapsulation layer PCL can be made of an organic material such as SiOCz acryl or epoxy resin. The organic encapsulation layer PCL can be formed by a coating process, for example, an ink-jet coating process or a slit coating process.

The electroluminescence display device according to the first embodiment of the present disclosure can further include a dam structure. The dam structure includes an outer dam DMO arranged outside the display area AA and an inner dam DMI arranged inside the display area AA. The outer dam DMO is arranged in the non-display area IA of the substrate SUB to prevent the organic encapsulation layer PCL from overflowing to the outside of the display area AA. The inner dam DMI is arranged to surround the through-hole TH inside the display area AA. The outer dam DMO is only shown in FIG. 4, and the inner dam DMI is only shown in FIG. 3.

The outer dam DMO according to one example can be arranged outside the display area AA. In more detail, the outer dam DMO can be arranged outside the gate driving circuit 200, which is arranged outside the display area, and the common power line CPL arranged outside the gate driving circuit 200. As the case can be, the outer dam DMO can be arranged to overlap an outer side of the common power line CPL. In this case, a width of the non-display area IA where the gate driving circuit 200 and the common power line CPL are arranged can be reduced to reduce a bezel width.

The dam structure according to the first embodiment of the present disclosure, including the inner dam DMI and the outer dam DMO, can have a triple layered structure, in which the corresponding layers are formed to be perpendicular to the substrate SUB. For example, the dam structure can include a first layer formed of a planarization layer PLN, a second layer formed of a bank BN, and a third layer formed of a spacer SP.

The first layer can have a pattern trapezoidal section structure of the planarization layer PLN. The second layer can have a trapezoidal section structure deposited on the first layer. The third layer can have a trapezoidal section structure deposited on the second layer. If the organic encapsulation layer PCL is thin to easily control spreading of the organic encapsulation layer PCL, the dam structure may not be required to be high. In this case, the third layer may be omitted.

The dam structure is fully covered by the first inorganic encapsulation layer PAS1 and/or the second inorganic encapsulation layer PAS2. The dam structure is intended to seal the organic encapsulation layer PCL in an inner space, and is not covered by the organic encapsulation layer PCL. The organic encapsulation layer PCL can be in contact with a portion of an inner wall of the dam structure. For example, a height from an edge area of the organic encapsulation layer PCL to an upper surface can be higher than the first layer of the dam structure and lower than the second layer of the dam structure. Alternatively, the height from the edge area of the organic encapsulation layer PCL to the upper surface can be higher than the second layer of the dam structure and lower than the third layer of the dam structure.

Preferably, the height from the edge area of the organic encapsulation layer PCL to the upper surface can be lower than the entire height of the dam structure. As a result, the first inorganic encapsulation layer PAS1 and the second inorganic encapsulation layer PAS2 are in surface-contact with each other on the upper surface and the outer sidewall of the dam structure.

A structure of the inner dam DMI according to one embodiment of the present disclosure will be described in more detail. The inner dam DMI according to one embodiment of the present disclosure is arranged between the through-hole TH and the adjacent pixels P' surrounding the through-hole TH inside the display area AA. Therefore, unlike the outer dam DMO, some elements of the light emitting diode ED can be deposited on the inner dam DMI. For example, the light emitting layer EL and the common electrode CE can be deposited to overstride the inner dam DMI.

The inner dam DMI can have a forward tapered shape. If the inner dam DMI has a forward tapered shape, although the organic encapsulation layer PCL can be prevented from being lost near the through-hole TH, the light emitting layer EL can be exposed from the sidewall of the through-hole TH and therefore can be vulnerable to water permeation. To avoid this, the inner dam DMI can have an inverse tapered shape. If the inner dam DMI has an inverse tapered shape, the light emitting layer EL can have a disconnection structure at a lower end of the inner dam DMI. In this case, water permeated through the portion exposed by the through-hole TH of the light emitting layer EL can be prevented from being diffused to the adjacent pixels P' arranged near the through-hole TH.

In order to make sure of a display area ratio of the display area AA to the maximum range, it is preferable that the inner dam DMI is arranged to be very close to the through-hole TH. Therefore, water permeation cannot be shielded completely by the inner dam DMI of the inverse tapered shape. In the first embodiment of the present disclosure, the trench TR is further provided to completely shield water permeated through the light emitting layer EL exposed at the side of the through-hole TH from being diffused to the adjacent pixels P' regardless of the forward tapered shape or the inverse tapered shape of the inner dam DMI.

Hereinafter, the trench according to the first embodiment of the present disclosure will be described in more detail with reference to FIG. 5. FIG. 5 is an enlarged cross-sectional view specifically illustrating a trench portion in the first embodiment of the present disclosure.

Figure 5:
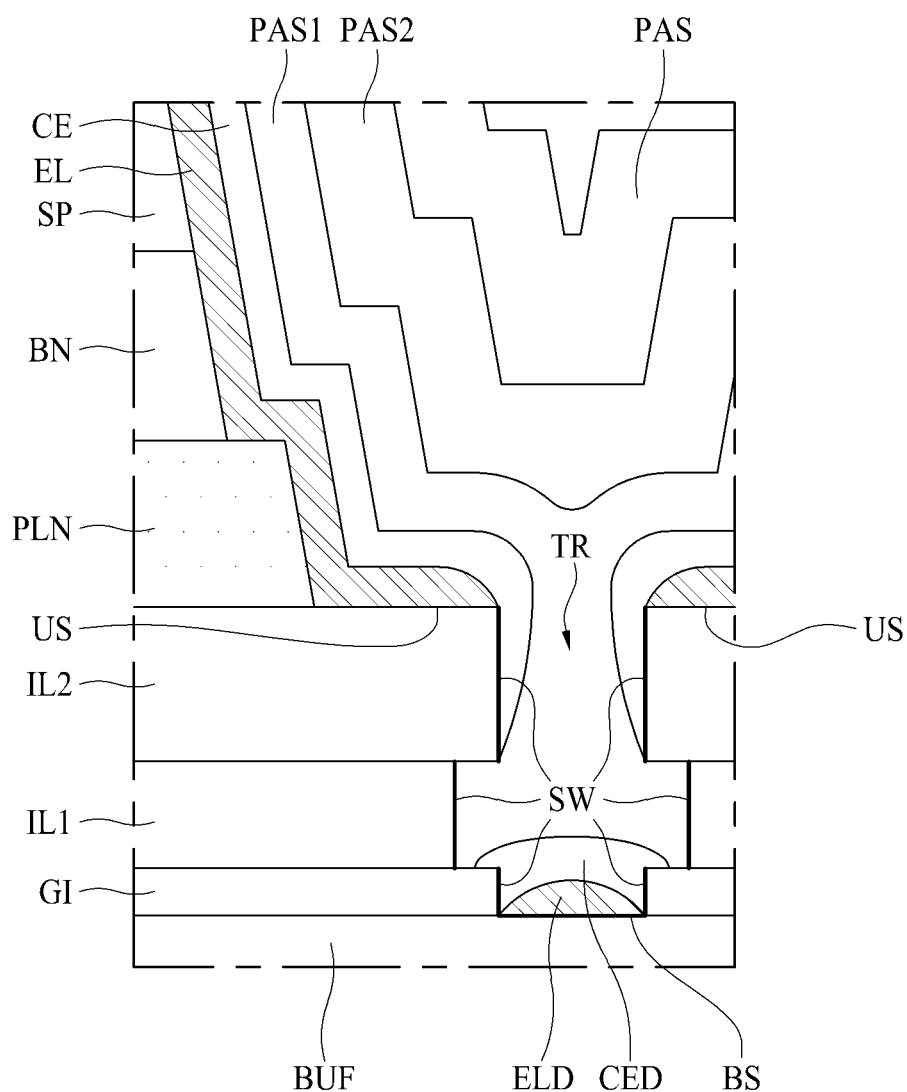
FIG. 5 is an enlarged cross-sectional view specifically illustrating a trench portion in the first embodiment of the present disclosure.

Referring to FIG. 5, the trench TR has a closed curve shape corresponding to the shape of the through-hole TH. For example, if the through-hole TH has a circular shape, the trench TR can have a circular shape. Alternatively, the trench TR can have an oval shape surrounding the through-hole TH regardless of the shape of the through-hole TH. For another example, if the through-hole TH has a rectangular shape, a hexagonal shape or an octagonal shape, the trench TR can have any one of a polygonal shape, a circular shape and an oval shape, which surround the through-hole TH. Hereinafter, for convenience, a description will be given based on that the through-hole TH has a circular shape and the trench TR has a circular shape surrounding the through-hole TH while having a concentric circle with the through-hole TH.

Preferably, the trench TR is arranged between the inner dam DMI and the through-hole TH. In view of a sectional structure, the trench TR can have a well or recessed shape from which insulating films included in the pixel array layer 120 deposited on the buffer film BUF are removed as much as a certain width. In more detail, the trench TR can be formed by etching the inorganic insulating film included in the pixel array layer 120 after the pixel array layer 120 is formed on the substrate SUB, the pixel driving electrode AE is deposited, and the bank BN for defining the light emitting area is patterned.

For example, after the thin film transistor T is formed during the process of forming the pixel array layer 120 and the planarization layer PLN is deposited, the planarization layer PLN can be patterned such that the planarization layer PLN can be removed from a certain area near the through-hole TH. At this time, the area from which the planarization layer PLN is removed can have a closed curve shape surrounding the through-hole TH.

Preferably, the trench TR is formed before the light emitting diode ED is deposited on the area from which the planarization layer PLN is removed. For example, the trench TR for exposing the upper surface of the second insulating film IL2 is formed by removing the first insulating film ILL the second insulating film IL2 and the gate insulating film GI, which are included in the thin film transistor layer.

The trench TR includes a bottom surface BS, an upper surface US, and a sidewall SW connecting the bottom surface BS with the upper surface US. The bottom surface BS can be defined as a surface of the substrate SUB or the buffer film BUF, which is exposed by passing through the first insulating film IL1, the second insulating film IL2 and the gate insulating film GI. The upper surface US can be defined as a surface of the second insulating film IL2 near the trench TR. The sidewall SW can be defined as an inner sidewall of the trench TR connecting the bottom surface BS with the upper surface US.

The sidewall SW of the trench TR has a saw-tooth surface which is uneven due to a difference in an etching rate during the process of etching the thin film transistors having different characteristics, especially their respective etching ratios different from each other with respect to a specific etching solution. For example, as shown in FIG. 5, if the gate insulating film GI and the second insulating film IL2 are made of the same inorganic material and the first insulating film IL1 is made of another inorganic material, especially a material having a high etching rate with respect to a specific etching solution, a sidewall of the first insulating film IL1 can be over-etched inside the trench TR.

After the trench TR having a saw-tooth shape is formed, the light emitting layer EL is deposited. The light emitting layer EL is deposited on the bottom surface BS of the trench TR and the upper surface US of the trench TR. As the sidewall SW of the trench TR has a saw-tooth surface, the light emitting layer EL is not continuously deposited on the sidewall SW of the trench TR but has a disconnection structure as shown in FIG. 5. For example, a dummy light emitting layer ELD obtained by detaching a residue of the light emitting layer from the light emitting layer EL is deposited on the bottom surface BS of the trench TR. Therefore, even though the water is permeated into the light emitting layer EL exposed to the side of the through-hole TH, water can completely be shielded from being diffused to the adjacent pixels P' arranged near the through-hole TH by the trench TR.

The common electrode CE is deposited on the light emitting layer EL. The common electrode CE is deposited on the upper surface US and the bottom surface BS of the trench TR. As the case can be, the common electrode CE is partially deposited on the sidewall SW of the trench TR. However, since the sidewall SW of the trench TR has a saw-tooth surface, the common electrode CE fails to fully cover the sidewall SW, and has a shape of a dummy common electrode CED that covers the dummy light emitting layer ELD which is a residue of the light emitting layer in the inner space of the trench TR.

The encapsulation layer 130 is deposited on the common electrode CE. Particularly, the first inorganic encapsulation layer PAS1 of the encapsulation layer 130 is first deposited. The first inorganic encapsulation layer PAS1 is deposited on the upper surface US and the bottom surface BS of the trench TR. Also, the first inorganic encapsulation layer PAS1 can also be deposited on the sidewall SW of the trench TR. Since the dummy light emitting layer ELD and the dummy common electrode CED are deposited on the bottom surface BS of the trench TR to fill the bottom surface BS, the first inorganic encapsulation layer PAS1 can have a shape for almost filling the inside of the trench TR.

The organic encapsulation layer PCL is deposited on the first inorganic encapsulation layer PAS1. Since the organic encapsulation layer PCL is deposited on a space between the inner dam DMI and the outer dam DMO, the organic encapsulation layer PCL is not deposited on the trench TR.

The second inorganic encapsulation layer PAS2 is deposited on the organic encapsulation layer PCL. Since the organic encapsulation layer PCL is not deposited on the trench TR, the second inorganic encapsulation layer PAS2 on the first inorganic encapsulation layer PAS1 is deposited on the trench TR in direct contact with the trench TR. The second inorganic encapsulation layer PAS2 can be deposited to fully cover the trench TR.

The trench TR according to the present disclosure can have a sectional shape of a forward tapered shape or an inverse tapered shape. Since the sidewall of the trench TR has a saw-tooth shape, the light emitting layer EL is not continuously deposited on the sidewall SW. Therefore, the trench TR does not need to have an inverse tapered sectional shape to disconnect continuity of the light emitting layer EL. The saw-tooth surface of the sidewall SW can be provided with different insulating layers deposited thereon by selecting materials having their respective etching rates with respective to each insulating layer as an etching solution.

Referring to FIG. 3 again, a structure of an end HL of the through-hole TH will be described. The end HL of the through-hole TH means a rim that determines a shape of the through-hole TH. The etch-stopper ES, an end TL of a first thin film layer and an end EPL of a second thin film layer are arranged between the end HL of the through-hole TH and the trench TR.

The first thin film layer is comprised of inorganic thin film layers included in the thin film transistor layer. For example, the first thin film layer can include a buffer film BUF, a gate insulating film GI, a first insulating film ILL and a second insulating film IL2. Therefore, the end TL of the first thin film layer is a boundary line defined to remove or so as not to form the buffer film BUF, the gate insulating film GI, the first insulating film IL1 and the second insulating film IL2 from or in the through-hole TH. Preferably, the end TL of the first thin film layer is defined between the end HL of the through-hole TH and the trench TR.

The etch-stopper ES is formed between the end TL of the first thin film layer and the trench TR. The etch-stopper ES is formed on the thin film transistor layer, especially the upper surface of the second insulating film IL2, and preferably has a ring shape which is a closed curve shape surrounding the through-hole TH. The etch-stopper ES is formed with a certain width between the end TL of the first thin film layer and the trench TR. The etch-stopper ES can be formed together with any one of the planarization layer PLN, the bank BN and the spacer SP when any one of them is formed.

The end EPL of the second thin film layer is arranged on the upper surface of the etch-stopper ES. The second thin film layer is comprised of thin film layers deposited on the planarization layer PLN. For example, the second thin film layer can include a light emitting layer EL, a common electrode CE, a first inorganic encapsulation layer PAS1 and a second inorganic encapsulation layer PAS2. The first thin film layer includes thin films made of inorganic materials, whereas the second thin film layer includes a light emitting layer EL of an organic material. When the light emitting layer EL, the common electrode CE, the first inorganic encapsulation layer PAS1 and the second inorganic encapsulation layer PAS2 are deposited on the etch-stopper ES and then patterned by an etching process, an etching end is set using the etch-stopper ES. Therefore, the first thin film layers arranged below the etch-stopper ES can be prevented from being over-etched or damaged by the etch-stopper ES.

Also, since the first thin film layer and the second thin film layer are respectively patterned based on the boundary of the etch-stopper ES, the end TL of the first thin film layer and the end EPL of the second thin film layer are arranged at their respective positions different from each other. Therefore, in the deposited structure of the second thin film layer, the etch-stopper ES and the first thin film layer, three step difference portions are provided. In this structure, if an upper passivation film PAS is deposited, the upper passivation film PAS deposited on the three step difference portions can maintain a uniform thickness over an entire deposited area without a deviation. The upper passivation film PAS is deposited on a single layer section portion of the light emitting layer EL without a thickness change or loss, whereby water or oxygen permeation can effectively be blocked.

Preferably, an end of the upper passivation film PAS is formed to be matched with the end of the through-hole TH to completely cover all of ends of the thin film layers formed between the through-hole TH and the trench TR, especially the exposed end of the light emitting layer EL. In detail, the upper passivation film PAS covers all of the ends of the second inorganic encapsulation layer PAS2, the first inorganic encapsulation layer PAS1, the common electrode CE and the light emitting layer EL which cover some portions of the upper surface of the etch-stopper ES, and the other portion of the etch-stopper ES, and reaches to the end HL of the through-hole TH.

Second Embodiment

Figure 6:
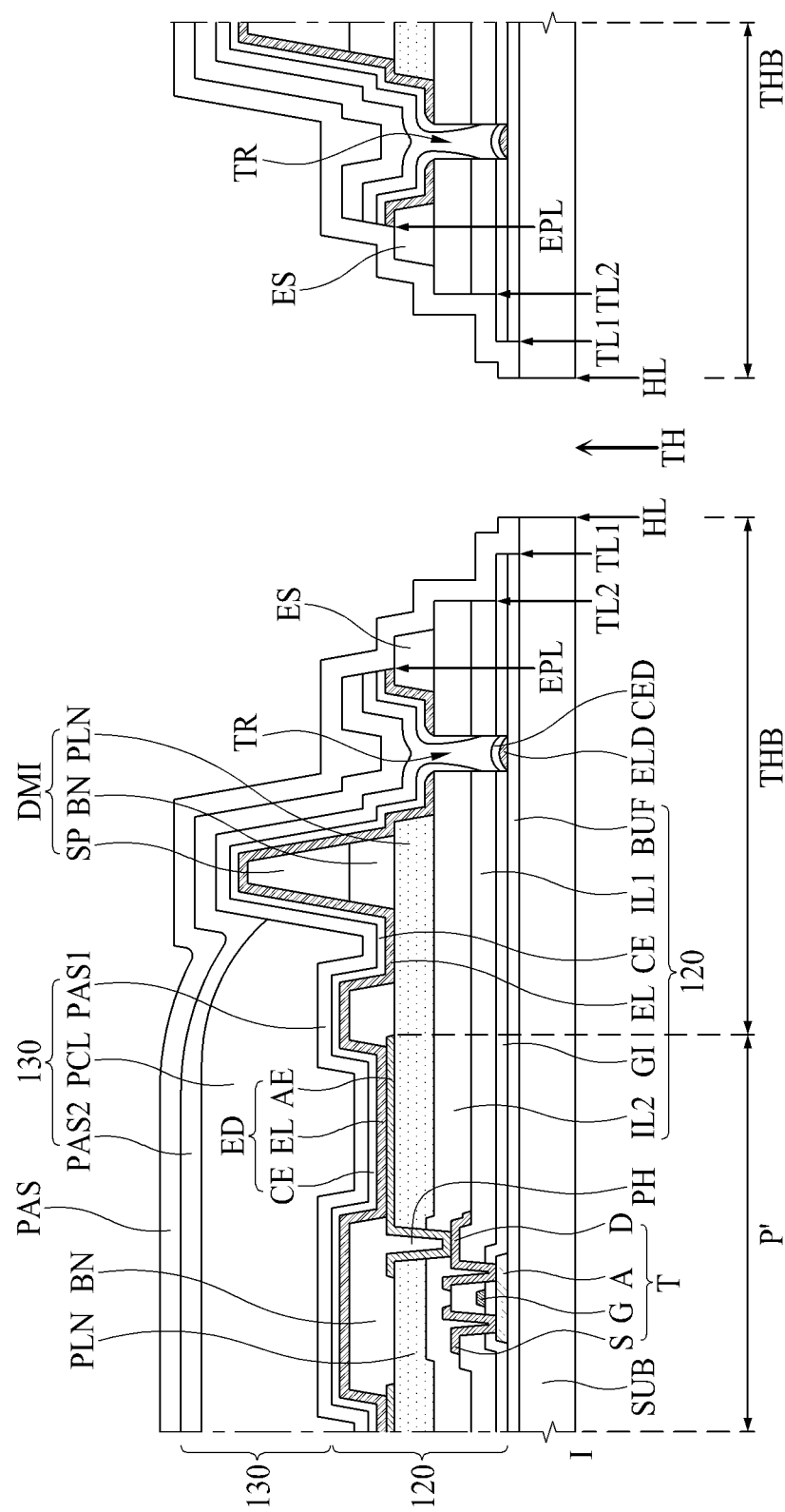
FIG. 6 is a cross-sectional view taken along line I-I' of FIG. 1, illustrating a structure of a portion where a through-hole is arranged in an electroluminescence display device according to a second embodiment of the present disclosure.

Hereinafter, the electroluminescence display device according to the second embodiment of the present disclosure will be described with reference to FIG. 6. FIG. 6 is a cross-sectional view taken along line I-I' of FIG. 1, illustrating a structure of a portion where a through-hole is arranged in an electroluminescence display device according to the second embodiment of the present disclosure.

Referring to FIG. 6, the electroluminescence display device according to the second embodiment of the present disclosure has an almost same structure as that of the first embodiment except a structure between the etch-stopper ES and the through-hole TH. Therefore, a description of the same elements will be omitted or a description will be given based on main parts. Also, since a structure of a portion where an outer dam DMO is formed is the same as that of the first embodiment, it can easily be understood with reference to the first embodiment based on FIG. 4 even without a separate description.

Referring to FIG. 6, the electroluminescence display device according to the second embodiment of the present disclosure can include a substrate SUB, a buffer film BUF, a pixel array layer 120, a spacer SP, an inner dam DMI, an outer dam DMO, an encapsulation layer 130, an upper passivation film PAS, an etch-stopper ES, and a through-hole TH.

Hereinafter, a repeated description of elements the same as or similar to those of the electroluminescence display device according to the first embodiment of the present disclosure will be omitted in the description of the second embodiment. A description of the second embodiment will be given based on an end structure of the through-hole TH which is a characteristic portion different from the first embodiment.

An end HL of the through-hole TH means a rim that determines a shape of the through-hole TH. The etch-stopper ES, an end TL1 of a lower thin film layer and an end TL2 of an upper thin film layer, which constitute a first thin film layer, and an end EPL of a second thin film layer are arranged between the end HL of the through-hole TH and a trench TR.

The first thin film layer is comprised of inorganic thin film layers included in a thin film transistor layer. For example, the first thin film layer can include a buffer film BUF, a gate insulating film GI, a first insulating film IL1 and a second insulating film IL2. Particularly, the first thin film layer can include a lower thin film layer and an upper thin film layer. For example, the lower thin film layer can be comprised of a buffer film BUF and a gate insulating film GI, and the upper thin film layer can be comprised of a first insulating film IL1 and a second insulating film IL2. Therefore, the end TL1 of the lower thin film layer is a boundary line defined to remove or so as not to form the buffer film BUF and the gate insulating film GI from or in the through-hole TH. Likewise, the end TL2 of the upper thin film layer is a boundary line defined to remove or so as not to form the first insulating film IL1 and the second insulating film IL2 from or in the through-hole TH.

The end TL1 of the lower thin film layer can be defined at a position closest to the through-hole TH between the end HL of the through-hole TH and the trench TR. Meanwhile, the end TL2 of the upper thin film layer can be defined between the end TL1 of the lower thin film layer and the trench TR. That is, the upper thin film layer and the lower thin film layer can have a step shape at the portion of the through-hole TH.

The etch-stopper ES is formed between the end TL of the first thin film layer and the trench TR. The etch-stopper ES is formed on the upper thin film layer, especially the upper surface of the second insulating film IL2, and preferably has a ring shape which is a closed curve shape surrounding the through-hole TH. The etch-stopper ES is formed with a certain width between the end TL2 of the upper thin film layer and the trench TR. The etch-stopper ES can be formed together with any one of the planarization layer PLN, the bank BN and the spacer SP when any one of them is formed.

The end EPL of the second thin film layer is arranged on the upper surface of the etch-stopper ES. The second thin film layer is comprised of thin film layers deposited on the planarization layer PLN. For example, the second thin film layer can include a light emitting layer EL, a common electrode CE, a first inorganic encapsulation layer PAS1 and a second inorganic encapsulation layer PAS2. The upper thin film layer and the lower thin film layer include thin films made of inorganic materials, whereas the second thin film layer includes a light emitting layer EL of an organic material. When the light emitting layer EL, the common electrode CE, the first inorganic encapsulation layer PAS1 and the second inorganic encapsulation layer PAS2 are deposited on the etch-stopper ES and then patterned by an etching process, an etching end is set using the etch-stopper ES. Therefore, the upper thin film layer and/or the lower thin film layer arranged below the etch-stopper ES can be prevented from being over-etched or damaged by the etch-stopper ES.

Also, since the upper thin film layer and the second thin film layer are respectively patterned based on the boundary of the etch-stopper ES, the end TL2 of the upper thin film layer and the end EPL of the second thin film layer are arranged at their respective positions different from each other. Therefore, in the deposited structure of the second thin film layer, the etch-stopper ES, the upper thin film layer and the lower thin film layer, four step difference portions are provided. In this structure, if an upper passivation film PAS is deposited, the upper passivation film PAS deposited on the four step difference portions can maintain a uniform thickness over an entire deposited area without a deviation. The upper passivation film PAS is deposited on a single layer section portion of the light emitting layer EL without a thickness change or loss, whereby water or oxygen permeation can effectively be blocked.

The upper passivation film PAS is deposited on the encapsulation layer 130, and is preferably reached to the end of the through-hole TH to completely cover sections of the thin film layers. In detail, the end TL1 of the lower thin film layer is arranged between the end EPL of the second thin film layer and the end HL of the through-hole TH. The end TL2 of the upper thin film layer is arranged between the end EPL of the second thin film layer and the end TL1 of the lower thin film layer. Therefore, the upper passivation film PAS covers the end TL2 of the upper thin film layer.

Also, in FIG. 6, the end TL1 of the lower thin film layer is arranged to be more inwardly than the end HL of the through-hole TH. In this case, the upper passivation film PAS covers the end TL1 of the lower thin film layer and is formed to be matched with the end HL of the through-hole TH. However, without limitation to this example, the end TL1 of the lower thin film layer can be formed to be matched with the end HL of the through-hole TH. In this case, the upper passivation film PAS can be formed such that the end TL1 of the lower thin film layer can be matched with the end HL of the through-hole TH.

As described above, if the thin films at the boundary portion of the through-hole TH have a step shape of several layers, cohesion of the thin films is increased, whereby delamination is not generated. Therefore, in the electroluminescence display device according to the first and second embodiments of the present disclosure, the through-hole TH has a structure for preventing a damage from occurring and shielding water and oxygen permeation.

Third Embodiment

Figure 7:
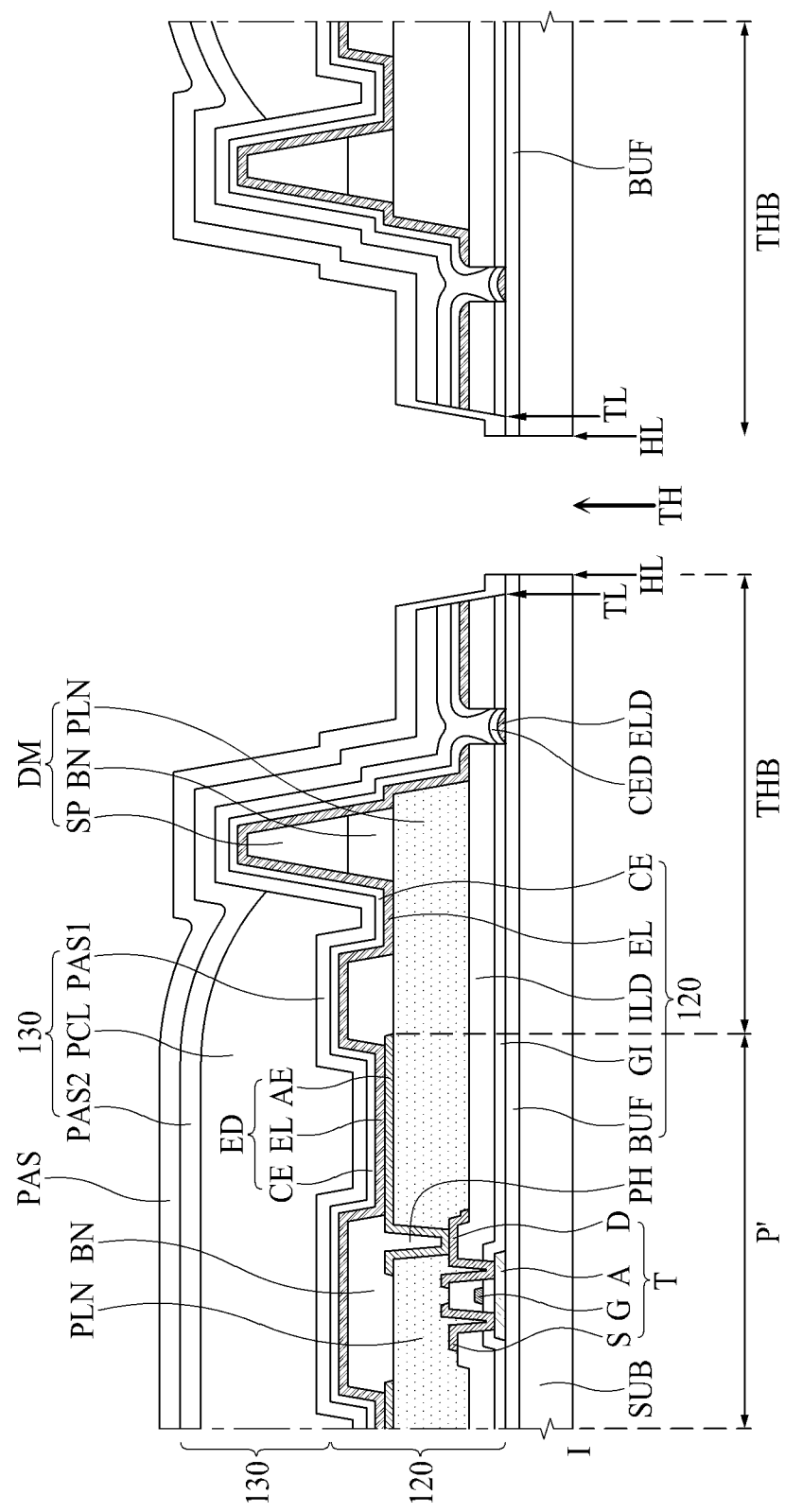
FIG. 7 is a cross-sectional view taken along line I-I' of FIG. 1, illustrating a structure of a portion where a through-hole is arranged in an electroluminescence display device according to a third embodiment of the present disclosure.

Hereinafter, the electroluminescence display device according to the third embodiment of the present disclosure will be described with reference to FIG. 7. FIG. 7 is a cross-sectional view taken along line I-I' of FIG. 1, illustrating a structure of a portion where a through-hole is arranged in an electroluminescence display device according to the third embodiment of the present disclosure. In a structure of the electroluminescence display device according to the third embodiment of the present disclosure, most of elements are the same as those of the first and second embodiments except a structure between the trench TR and the through-hole TH. Therefore, a description will be given based on a different portion.

Referring to FIG. 7, an end HL of the through-hole TH means a rim that determines a shape of the through-hole TH. An end TL of a thin film layer is arranged between the end HL of the through-hole TH and the trench TR. In this case, the thin film layer is comprised of thin films deposited on a thin film transistor layer and a bank BN. For example, the thin film layer includes a buffer film BUF, a gate insulating film GI, and an inter-layer dielectric (ILD) film, and includes a light emitting layer EL, a common electrode CE, a first inorganic encapsulation layer PAS1 and a second inorganic encapsulation layer PAS2, which are deposited on the planarization layer PLN.

The end TL of the thin film layer is a boundary line defined to remove or so as not to form the buffer film BUF and the gate insulating film GI from or in the through-hole TH. The end TL of the thin film layer can be defined between the end HL of the through-hole TH and the trench TR.

A single layer section of the thin film layers is exposed to the end TL of the thin film layer. Particularly, the section of the light emitting layer EL is exposed. An upper passivation film PAS is deposited to prevent water and/or oxygen from being permeated through the section of the light emitting layer EL. Preferably, the upper passivation film PAS is an inorganic material film deposited on the encapsulation layer 130. For example, the end TL of the thin film layer, which includes a gate insulating film GI, an inter-layer dielectric ILD film, a light emitting layer EL, a first inorganic encapsulation layer PAS1 and a second inorganic encapsulation layer PAS2, can be formed to be far away from the end HL of the through-hole TH at a certain distance. It is preferable that the upper passivation film PAS is formed on the encapsulation layer 130 to cover a single layer surface constituting the end TL of the thin film layer. Preferably, the end of the upper passivation film PAS is matched with the end of the through-hole TH.

In the electroluminescence display device according to the third embodiment of the present disclosure, the through-hole TH is provided inside the display area AA. Particularly, an inner dam DMI is provided near the through-hole TH such that the ends of the inorganic light emitting layers and the light emitting layer are exposed to the end of the through-hole TH. In order to prevent water permeated to the end of the light emitting layer from being diffused to the pixel P, the trench TR for disconnecting the light emitting layer EL is arranged between the through-hole TH and the inner dam DMI. Also, the section of the light emitting layer EL exposed to the end TL of the thin film layer including the light emitting layer EL defined to be more inwardly than the end HL of the through-hole TH is covered by the upper passivation film PAS to prevent and shield water permeation from occurring.

However, the single layer section formed at the end TL of the thin film layer is a section where several thin film layers are deposited continuously and has a gradient which is very steep. In this state, if the upper passivation film PAS is deposited, the upper passivation film PAS can be deposited on an inclined surface very thinly or a partial defect can occur. Since water or oxygen may permeate into the defect portion, it is preferable that the upper passivation film PAS can be deposited thickly or has a deposited structure of a double or triple layer.

In the electroluminescence display device according to the third embodiment of the present disclosure, since the end TL of the thin film layer is set in one position, there is no etch-stopper ES. Therefore, it is more advantageous than the first and second embodiments in that a boundary portion of the through-hole TH can be minimized. Meanwhile, in the electroluminescence display device according to the first and second embodiments of the present disclosure, the ends of the thin film layers are arranged to be spaced apart from each other at a certain distance without being overlapped with each other due to the etch-stopper ES, whereby the thickness of the upper passivation film PAS can uniformly be maintained.

The electroluminescence display device according to the preferred embodiments of the present disclosure can be applied to various products such as a television, a notebook computer, a monitor, a refrigerator, a microwave oven, a washing machine and a camera as well as portable electronic devices such as an electronic diary, an electronic book, a PMP (Portable Multimedia Player), a navigator, a UMPC (Ultra Mobile PC), a smart phone, a mobile communication terminal, a mobile phone, a tablet PC (personal computer), a smart watch, a watch phone and a wearable device.

It will be apparent to those skilled in the art that the present disclosure described above is not limited by the above-described embodiments and the accompanying drawings and that various substitutions, modifications, and variations can be made in the present disclosure without departing from the spirit or scope of the disclosures. Consequently, the scope of the present disclosure is defined by the accompanying claims, and it is intended that all variations or modifications derived from the meaning, scope, and equivalent concept of the claims fall within the scope of the present disclosure.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. An electroluminescence display device comprising:
    a substrate having a display area and a non-display area arranged near the display area;
    a light emitting diode in the display area;
    an encapsulation layer on the light emitting diode;
    a through-hole arranged inside the display area to penetrate the substrate;
    an inner dam surrounding the through-hole;
    a trench arranged between the inner dam and the through-hole;
    an etch-stopper arranged between the trench and the through-hole; and
    an upper passivation film disposed on the display area and covering the inner dam, the trench and an upper surface of the etch-stopper.

2. The electroluminescence display device of claim 1, further comprising an insulating layer on which the etch-stopper is arranged,
    wherein the insulating layer is disposed on the display area and passing below the inner dam and the trench except the through-hole.

3. The electroluminescence display device of claim 2, wherein the trench includes a recessed portion recessed to reach an upper surface of the substrate between the through-hole and the inner dam.

4. The electroluminescence display device of claim 3, wherein the trench includes:
    a bottom surface defined by the upper surface of the substrate exposed by the recessed portion of the trench;
    an upper surface defined on the uppermost surface near the recessed portion of the trench; and
    a sidewall connecting the bottom surface of the trench with the upper surface of the trench, and
    wherein a dummy light emitting layer of the light emitting diode is disposed on the bottom surface of the trench.

5. The electroluminescence display device of claim 4, wherein a light emitting layer is disposed on the upper surface of the trench.

6. The electroluminescence display device of claim 4, wherein a dummy common electrode is disposed on the dummy light emitting layer and comes into contact with the sidewall of the trench.

7. The electroluminescence display device of claim 4, wherein the sidewall of the trench has a saw-tooth shape due to a difference in an etching rate of thin film layers exposed to the sidewall of the trench.

8. The electroluminescence display device of claim 4, wherein the insulating layer includes a first insulating film and a second insulating film, and
    wherein an interval between the sidewall defined by the first insulating film is larger than an interval between the sidewall defined by the second insulating film.

9. The electroluminescence display device of claim 1, wherein the display area includes pixels having the light emitting diode for expressing image information and a driving element for driving the light emitting diode, the pixels being arranged in a matrix arrangement, and
    wherein the through-hole is an area where the substrate, the light emitting diode and the driving element are not provided.

10. The electroluminescence display device of claim 1, wherein the encapsulation layer comprises a first inorganic encapsulation layer, a second inorganic encapsulation layer and an organic encapsulation layer disposed between the first and second inorganic encapsulation layers.

11. The electroluminescence display device of claim 10, wherein the first inorganic encapsulation layer and the second inorganic encapsulation layer are configured to be a thin film layer covering the inner dam and the trench in the display area.

12. The electroluminescence display device of claim 11, wherein the thin film layer further comprises a light emitting layer of the light emitting diode.

13. The electroluminescence display device of claim 12, wherein an end of the insulating layer is arranged between an end of the thin film layer and an end of the through-hole.

14. The electroluminescence display device of claim 13, wherein the end of the insulating layer is disposed closer to the through-hole than an end of the etch-stopper, and
    wherein the end of the etch-stopper is disposed closer to the through-hole than an end of the first inorganic encapsulation layer.

15. The electroluminescence display device of claim 14, wherein the upper passivation film covers a side surface of the etch-stopper adjacent to the through-hole and a part of the upper surface of the etch-stopper.

16. The electroluminescence display device of claim 15, wherein the upper passivation film covers stepped portions formed by the thin film layer, the etch stopper and the insulating layer.

17. The electroluminescence display device of claim 12, wherein the light emitting layer covers a part of the etch-stopper in the display area, and is disconnected at the trench,
  wherein the first inorganic encapsulation layer and the second inorganic encapsulation layer cover one portion of the etch stopper in the display area, and
  wherein the upper passivation film covers the second inorganic encapsulation layer, the first inorganic encapsulation layer, a common electrode, the light emitting layer and the etch stopper.

18. The electroluminescence display device of claim 11, wherein the thin film layer covers a part of the upper surface of the etch-stopper.

19. The electroluminescence display device of claim 1, wherein the upper passivation film reaches to an end of the through-hole.

20. The electroluminescence display device of claim 1, further comprising a touch electrode disposed on the upper passivation film.

21. The electroluminescence display device of claim 1, wherein the etch-stopper is composed of organic materials.

* * * * *